United States Patent
Lin et al.

(10) Patent No.: US 12,439,663 B2
(45) Date of Patent: Oct. 7, 2025

(54) INTEGRATION OF LOW AND HIGH VOLTAGE DEVICES ON SUBSTRATE

(71) Applicant: Taiwan Semiconductor Manufacturing Company, Ltd., Hsinchu (TW)

(72) Inventors: Hsin Fu Lin, Hsinchu County (TW); Tsung-Hao Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/574,728

(22) Filed: Jan. 13, 2022

(65) Prior Publication Data
US 2023/0011246 A1   Jan. 12, 2023

Related U.S. Application Data

(60) Provisional application No. 63/220,167, filed on Jul. 9, 2021.

(51) Int. Cl.
*H10D 62/17*   (2025.01)
*H10D 30/01*   (2025.01)
(Continued)

(52) U.S. Cl.
CPC ......... *H10D 62/299* (2025.01); *H10D 30/027* (2025.01); *H10D 30/65* (2025.01);
(Continued)

(58) Field of Classification Search
CPC .......... H01L 29/66568; H01L 29/1041; H01L 29/0634; H01L 29/1095; H01L 29/7816;
(Continued)

(56) References Cited

U.S. PATENT DOCUMENTS 5,698,884 A    12/1997  Dennen
6,475,870 B1 *  11/2002  Huang ................ H01L 29/1083
                                                257/E29.268
(Continued)

FOREIGN PATENT DOCUMENTS

DE         10052007 C1 *  3/2002  ......... H01L 29/0634

OTHER PUBLICATIONS

Non-Final Office Action dated Jun. 18, 2024 for U.S. Appl. No. 18/363,077.
(Continued)

*Primary Examiner* — David Chen
(74) *Attorney, Agent, or Firm* — Eschweiler & Potashnik, LLC

(57) ABSTRACT

The present disclosure relates to a semiconductor structure that includes a well region and a semiconductor substrate. The well region is disposed within the semiconductor substrate. The well region includes a plurality of first regions separated by a plurality of second regions, where the plurality of first regions is of a first doping and the plurality of second regions are of a second doping different than the first doping. A gate electrode overlies the well region where the gate electrode is disposed laterally over a portion of the plurality of first regions and a portion of the plurality of second regions.

20 Claims, 9 Drawing Sheets

(51) Int. Cl.
  *H10D 30/65*   (2025.01)
  *H10D 62/10*   (2025.01)
  *H10D 84/01*   (2025.01)
  *H10D 84/03*   (2025.01)
  *H01L 21/22*   (2006.01)
  *H01L 21/265*   (2006.01)
  *H01L 21/266*   (2006.01)

(52) U.S. Cl.
  CPC ......... *H10D 62/126* (2025.01); *H10D 62/307* (2025.01); *H10D 84/0156* (2025.01); *H10D 84/038* (2025.01); *H01L 21/22* (2013.01); *H01L 21/26513* (2013.01); *H01L 21/266* (2013.01)

(58) Field of Classification Search
  CPC ............. H01L 29/0696; H01L 29/0878; H01L 29/7835; H01L 29/66659; H01L 29/66681; H01L 29/0692; H01L 29/1045; H01L 21/266; H01L 21/26513; H01L 21/2253; H01L 21/22; H10D 62/299; H10D 30/027; H10D 30/65; H10D 62/126; H10D 62/307; H10D 84/0156; H10D 84/038; H10D 30/0221; H10D 30/60; H10D 62/116; H10D 84/83; H10D 84/013
  USPC ........ 438/153, 154, 181, 185, 286; 257/339, 257/341, 342, 29.027, 29.256
  See application file for complete search history.

(56) References Cited

U.S. PATENT DOCUMENTS

| | | | |
|---|---|---|---|
| 7,238,577 B1* | 7/2007 | Shafi | H01L 29/7824 257/E21.336 |
| 2002/0060330 A1* | 5/2002 | Onishi | H01L 29/0634 257/E29.264 |
| 2002/0179942 A1* | 12/2002 | Tihanyi | H01L 29/7801 257/E29.256 |
| 2003/0183858 A1* | 10/2003 | Kitagawa | H01L 29/7813 257/E29.256 |
| 2003/0207536 A1 | 11/2003 | Miyasaka et al. | |
| 2003/0230786 A1 | 12/2003 | Kim et al. | |
| 2004/0099923 A1* | 5/2004 | Tihanyi | H01L 29/7801 257/500 |
| 2006/0108600 A1* | 5/2006 | Okumura | H01L 29/7811 257/E21.418 |
| 2008/0261358 A1* | 10/2008 | Sonsky | H01L 21/3247 257/E21.616 |
| 2012/0217579 A1* | 8/2012 | Huang | H01L 29/0634 257/E29.256 |
| 2014/0225191 A1 | 8/2014 | Lotfi et al. | |
| 2015/0295026 A1 | 10/2015 | Chang et al. | |
| 2017/0033099 A1* | 2/2017 | Iwasaki | H10D 62/127 |
| 2018/0342577 A1 | 11/2018 | Fujii et al. | |
| 2019/0131390 A1 | 5/2019 | Huang et al. | |

OTHER PUBLICATIONS

Final Office Action dated Jan. 16, 2025 for U.S. Appl. No. 18/363,077.
Non-Final Office Action dated May 15, 2025 for U.S. Appl. No. 18/363,077.

* cited by examiner

1700 ⇘

| Form a single well mask over a semiconductor substrate and pattern the single well mask to form a plurality of slits separated by a plurality of first mask width. | ─ 1702 |

↓

| Perform a doping process through the plurality of slits to form a plurality of first regions separated by a plurality of second regions within a first well region. | ─ 1704 |

↓

| Remove the single well mask and form a STI structure in the semiconductor substrate abutting an outer edge of the first well region and form a gate dielectric and gate electrode over the first well region. | ─ 1706 |

↓

| Deposit and pattern a source/gate mask over the gate stack, first well region, STI structure, and semiconductor substrate to form source/gate doping openings over the first well region. | ─ 1708 |

↓

| Perform a source/drain doping process through the source/gate doping openings to form a source and a drain within the first well region. | ─ 1710 |

↓

| Deposit an ILD layer over the semiconductor substrate, first well region, STI structure, source, and drain. Form conductive contacts through the ILD layer that couple to the gate electrode, source, and drain. | ─ 1712 |

Fig. 17

INTEGRATION OF LOW AND HIGH VOLTAGE DEVICES ON SUBSTRATE

REFERENCE TO RELATED APPLICATION

This application claims priority to U.S. Provisional Application No. 63/220,167 filed on Jul. 9, 2021, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. To reduce the area of the IC, the semiconductor devices with differing threshold voltages may be formed in close proximity to one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 illustrates a flow diagram of some embodiments of a method for forming a first device with a first well region comprising a plurality of first regions separated by a plurality of second regions is provided.

DETAILED DESCRIPTION

Figure 1:
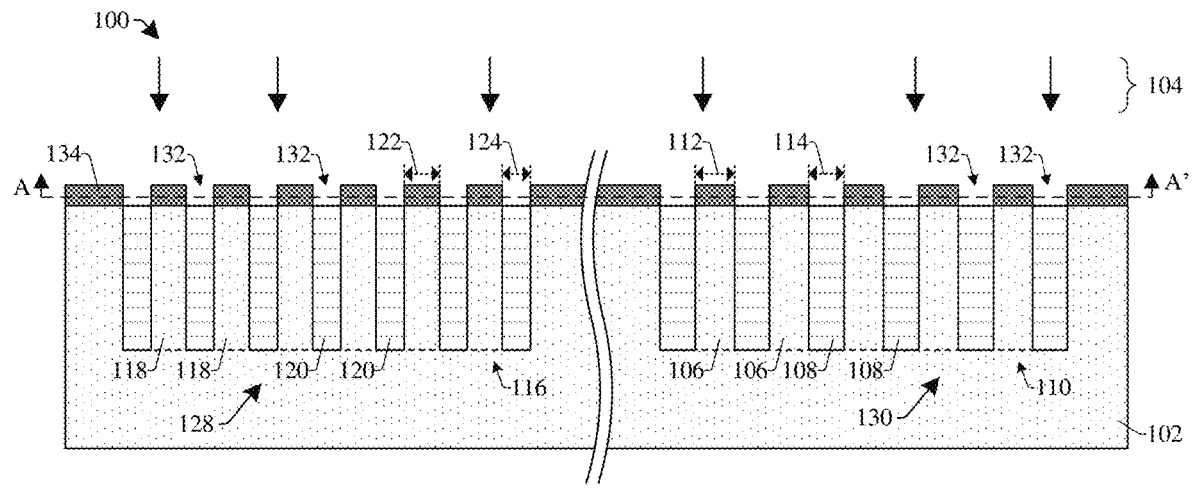
FIG. 1 illustrates a cross-sectional view of some embodiments of forming a semiconductor structure including a first well region and a second well region formed according to a single well mask.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit includes semiconductor devices with differing threshold voltages integrated in one substrate and in close proximity to one another. For example, various semiconductor devices may have high, medium, and low threshold voltages, or fine-tuned threshold voltage in a certain range. Forming devices that operate at different threshold voltages on one substrate is costly when multiple well masks and multiple implantation processes are needed. For example, forming a bipolar complementary metal oxide semiconductor double diffused metal oxide semiconductor (BCD) device comprises many complex manufacturing steps including multiple masking and implantation steps. Such complex manufacturing steps used to form BCD type devices or multiple devices of different threshold or control voltages reduce fabrication efficiency, result in high process costs, and may also introduce damage to the devices on the same substrate.

Various embodiments of the present disclosure relate to a semiconductor device with a gate overlying a well region comprising a plurality of first regions separated by a plurality of second regions in a semiconductor substrate. The plurality of first regions can include a first dopant, and the plurality of second regions can include a second dopant that is different from the first dopant. The first dopant and second dopant can, for example, be different dopant types or different dopant concentrations. By forming the well region with the plurality of first regions and the plurality of second regions, a threshold voltage of the semiconductor device can be controlled according to a doping density, a doping type, and a geometry of the plurality of first and second regions. Laterally offset from the gate is a source/drain with a source/drain dopant different than the first dopants and the second dopant. In some aspects, the source/drain overlie the plurality of first regions and the plurality of second regions.

In some embodiments, semiconductor devices operating at different threshold voltages, are formed in the semiconductor substrate. The well regions of the semiconductor devices can be formed according to a single mask with a plurality of slits separated by a plurality of widths, that after undergoing a doping process, result in the plurality of first regions separated by the plurality of second regions respectively for the semiconductor devices. Thus, the well regions of the semiconductor devices are formed according to the single mask where the one or more semiconductor devices can be formed respectively with a unique threshold voltage that can be different from one another. As such, the different threshold voltages associated with the semiconductor devices are realized by forming different geometries of the first regions and the second regions of the well regions without the use of multiple masking steps.

FIG. 1 illustrates a cross-sectional view of some embodiments of forming a semiconductor structure 100 including a first well region 116 (also referred to as a well region) and a second well region 110 formed according to a single well mask 134.

The semiconductor structure 100 comprises a single well mask 134 disposed over a semiconductor substrate 102. The single well mask 134 may be or comprise, for example, photoresist, silicon nitride, or some other suitable mask material. In some embodiments, a process for forming the single well mask 134 comprises depositing a mask layer and subsequently patterning the mask layer into the single well mask 134. In embodiments in which the mask layer is a photoresist, the patterning may, for example, be performed using photolithography or some other suitable process. The semiconductor substrate 102 may be or comprise, for example, silicon (Si), a monocrystalline silicon, germanium (Ge), silicon-germanium (SiGe), gallium arsenide (GaAs), some other semiconductor material, or a combination thereof.

The single well mask 134 comprises a plurality of slits 132 that extend through the single well mask. The plurality of slits 132 exposes top surfaces of a first well region 116 of a first device 128 and top surfaces of a second well region 110 of a second device 130. The first device 128 and the second device 130 can respectively be a semiconductor device (e.g. metal oxide semiconductor field effect transistor (MOSFET) or a laterally-diffused metal-oxide semiconductor (LDMOS) device). In some aspects, the first device 128 and the second device 130 are different semiconductor devices. For example, the first device 128 can be the MOSFET, while the second device 130 can be the LDMOS device. The plurality of slits 132 over the first well region 116 are of a first slit width 124 and separated by a first mask width 122 (sometimes referred to as a mask width). The plurality of slits 132 over the second well region 110 are of a second slit width 114 and separated by a second mask width 112.

A doping process 104 is performed through the plurality of slits 132 of the single well mask 134 to form the first well region 116 and the second well region 110 in the semiconductor substrate 102. The doping process 104 can include a second dopant that is different than a doping of the semiconductor substrate 102. In some embodiments, the second doping and the doping of the semiconductor substrate 102 can be of the same doping type (e.g., n-type or p-type) and different doping concentration or density. In other embodiments, the second doping and the doping of the semiconductor substrate 102 are of a different doping type. The doping process 104 forms a plurality of first regions 118 separated by a plurality of second regions 120 of the first device 128 and a plurality of first regions 106 separated by a plurality of second regions 108 of the second device 130. The plurality of first regions 118, 106 and the plurality of second regions 120, 108, extend from a top surface of the semiconductor substrate 102 to a bottom surface of the first well region 116 and the second well region 110.

In embodiments where the first device 128 and the second device 130 have different threshold voltages, the first slit width 124 and second slit width 114 are different, and/or the first mask width 122 and the second mask width 112 are different. As such, different doping profiles are achieved for the first device 128 and the second device 130 by controlling the first slit width 124, the second slit width 114, the first mask width 122, and the second mask width 112, and the threshold voltage of the first device 128 and the second device 130 are controlled separately according to the single well mask 134 and doping process 104.

Figure 2:
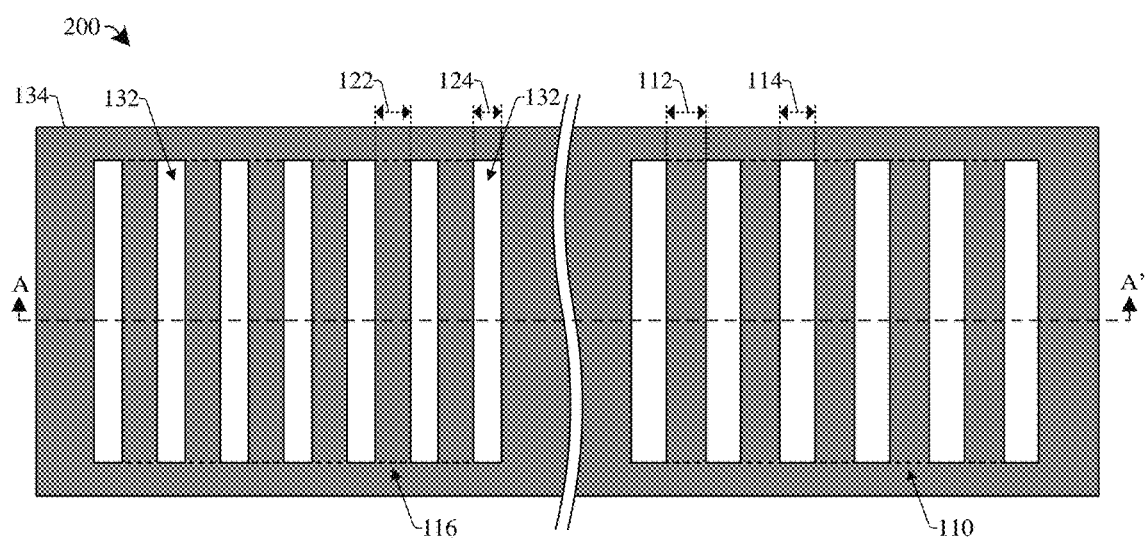
FIG. 2 illustrates a top view of some embodiments of forming the semiconductor structure as indicated by cut-lines A-A' in FIGS. 1 and 2.

FIG. 2 illustrates a top view 200 of some embodiments of forming the semiconductor structure 100 as indicated by cut-lines A-A' in FIGS. 1 and 2. The top view 200 shows cut-lines A-A' through the single well mask 134. The plurality of slits 132 are arranged in a horizontal direction covering the first well region 116 and the second well region 110.

Figure 3:
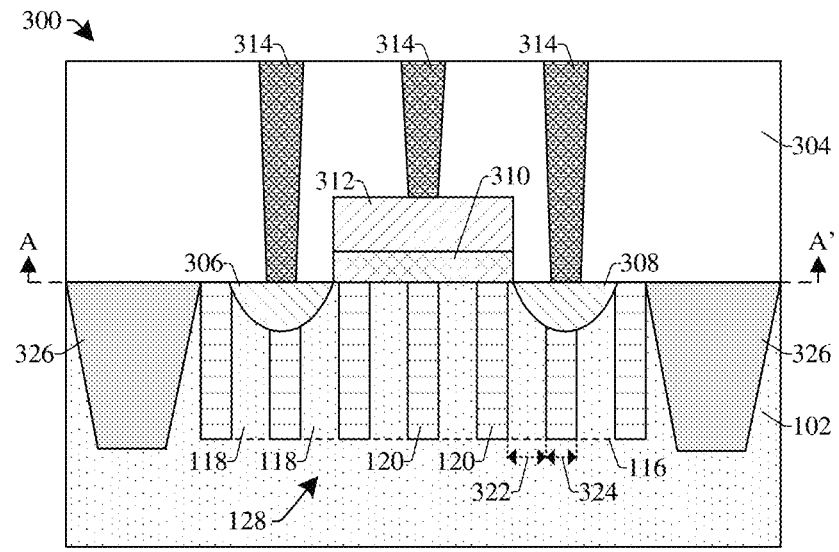
FIG. 3 illustrates a cross-sectional view of some embodiments of a semiconductor structure including a first well region with a plurality of first regions separated by a plurality of second regions.

FIG. 3 illustrates a cross-sectional view of some embodiments of a semiconductor structure 300 including a first well region 116 with a plurality of first regions 118 separated by a plurality of second regions 120.

The semiconductor structure 300 comprises an interlayer dielectric (ILD) layer 304 disposed over a semiconductor substrate 102. A first device 128 (e.g. metal oxide semiconductor field effect transistor (MOSFET)) is disposed in the ILD layer 304 and the semiconductor substrate 102. In some embodiments, the first device 128 is the same as the first device 128 of FIG. 1. The ILD layer 304 may comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

A first well region 116 is disposed within the semiconductor substrate 102 where the well region comprises a plurality of first regions 118 separated by a plurality of second regions 120. In some embodiments, the plurality of first regions 118 separated by the plurality of second regions 120 is formed according to the single well mask 134 of FIG. 1. The first well region 116 extends from a top surface of the semiconductor substrate 102 into the semiconductor substrate 102. The plurality of first regions 118 and the plurality of second regions 120 extend vertically from a top surface of the first well region 116 to a bottom surface of the first well region 116. The plurality of first regions 118 have a first width 322 and the plurality of second regions 120 have a second width 324 that is different than the first width 322. In some embodiments, the first width 322 and the second width 324 can be the same. It is understood that while the plurality of first and second regions 118, 120 are depicted to comprise a number of elements per region, the number of elements per region can be more or less.

The plurality of first regions 118 comprise a first doping and the plurality of second regions 120 comprise a second doping that is different from the first doping. In some embodiments, the second doping of the plurality of second regions 120 is formed according to the doping process 104 of FIG. 1. In some embodiments, the first doping and the second doping can be of the same doping type (e.g., n-type or p-type) and different doping concentration or density. In other embodiments, the first doping and the second doping are of a different doping type. In yet other embodiments, the first doping can be the same as a doping of the semiconductor substrate 102 or different than the doping of the semiconductor substrate 102.

A gate dielectric 310 is disposed over the first well region 116 in the ILD layer 304 between the first well region 116 and a gate electrode 312. In some embodiments, the gate dielectric 310 and the gate electrode 312 are collectively referred to as a gate stack. The gate stack overlies a portion of the plurality of first and second regions 118, 120. In some embodiments, the gate electrode 312 is or comprises polysilicon. In some embodiments, the gate electrode 312 may be or comprise a metal, such as aluminum (Al), copper (Cu), titanium (Ti), tantalum (Ta), tungsten (W), molybdenum (Mo), cobalt (Co), or the like. In such embodiments, the gate dielectric 310 may be or comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

A source 306 and a drain 308 are laterally offset from the gate electrode 312 on opposing sides of the gate electrode 312. The source 306 and the drain 308 extends laterally over a subset of the plurality of first and second regions 118, 120 from a first top surface of the plurality of first and second regions 118, 120 to above a second top surface of the plurality of first and second regions 118, 120. One or more of the plurality of first and second regions 118, 120 have a curved surface along one or more of the source 306 and the drain 308. The source 306 and the drain 308 can, for example, comprise the same doping type. The first device 128 comprises the gate stack, the source 306, the drain 308, and the first well region 116.

A shallow trench isolation (STI) structure 326 extends from a top surface of the semiconductor substrate 102 to below the bottom surface of the first well region 116. In alternative embodiments, the STI structure 326 extends to above the bottom surface of the first well region 116. The STI structure 326 abuts an outer edge of the first well region 116. The STI structure 326 can provide isolation between the first device 128 and other devices, for example, the second device 130 of FIG. 1. The STI structure 326 may, for example, be or comprise a dielectric material (e.g., silicon dioxide), a low-k dielectric, or the like. The ILD layer 304 comprises conductive contacts 314 that extend through the ILD layer 304 to contact the source 306, the drain 308, and the gate electrode 312. The conductive contacts 314 may, for example, be or comprise, tungsten (W), copper (Cu), aluminum (Al), or the like. The conductive contacts 314 are configured to provide electrical connections between various devices of an integrated chip (IC).

Figure 4:
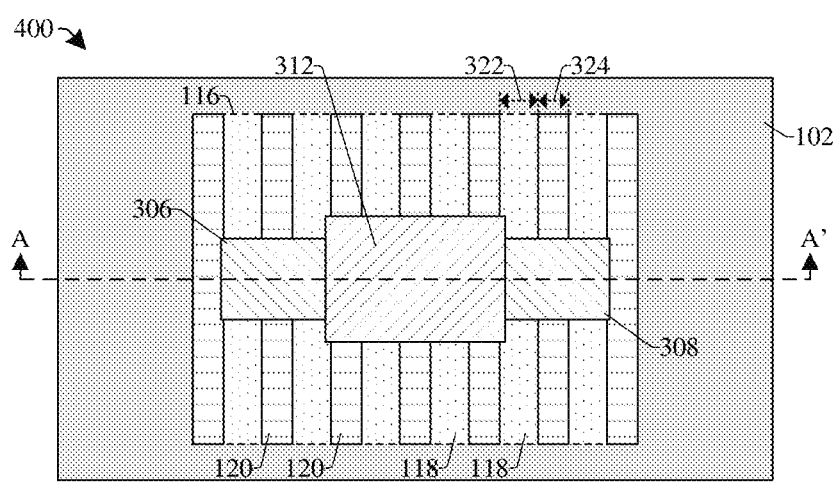
FIG. 4 illustrates a top view 400 of some embodiments of the semiconductor structure 300 as indicated by cut-lines A-A' in FIGS. 3 and 4.

FIG. 4 illustrates a top view 400 of some embodiments of the semiconductor structure 300 as indicated by cut-lines A-A' in FIGS. 3 and 4.

The top view 400 shows that the plurality of first and second regions 118, 120 extends in a lateral direction perpendicular to a longest length of the gate electrode 312. Furthermore, the plurality of first and second regions 118, 120 extends laterally past outer edges of the gate electrode 312, the source 306, and the drain 308.

The first width 322 of the plurality of first regions 118, the second width 324 of the plurality of second regions 120, the first doping of the plurality of first regions 118, and the second doping of the plurality of second regions 120 can collectively be referred to as voltage control parameters and relate to a threshold voltage of the first device 128. The voltage control parameters can be chosen to realize a desired threshold voltage of the first device 128 where the desired threshold voltage may be different than other devices. The voltage control parameters of the first device 128 and other devices (e.g. the second device 130 of FIG. 1) can be realized according to a single well mask (e.g. the single well mask 134 of FIG. 1) where different threshold voltages on a per device basis is achieved.

Figure 5:
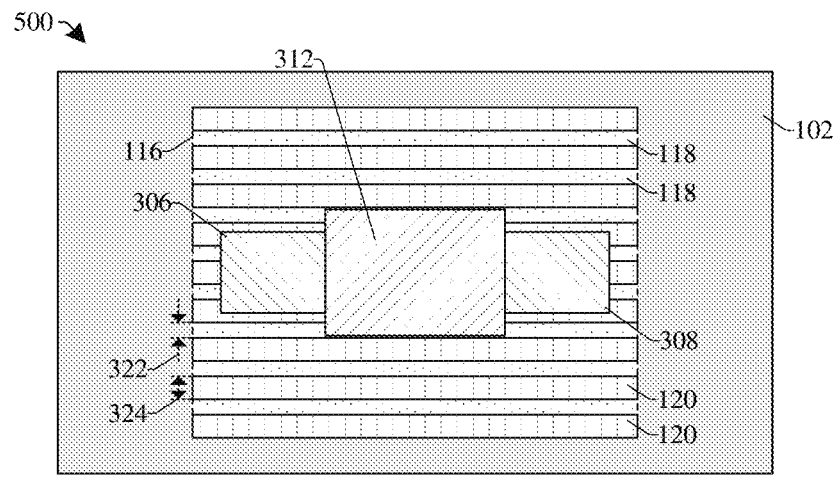
FIG. 5 illustrates a top view of some alternative embodiments of a semiconductor structure including a plurality of first regions separated by a plurality of second regions that are parallel to a longest length of a gate electrode.

FIG. 5 illustrates a top view 500 of some alternative embodiments of a semiconductor structure 300 including a plurality of first regions 118 separated by a plurality of second regions 120 that are parallel to a longest length of a gate electrode 312.

The top view 500 shows that the plurality of first and second regions 118, 120 extends in a lateral direction parallel to a longest length of the gate electrode 312. Furthermore, the plurality of first and second regions 118, 120 extend laterally past outer edges of the gate electrode 312, the source 306, and the drain 308. In some aspects, a longest edge of the source 306 or the drain 308 overlaps with one of the plurality of second regions 120 and a longest edge of the gate electrode 312 overlaps with one of the plurality of first regions 118. The longest edge of the source 306 or the drain 308 and the longest edge of the gate electrode 312 are not limited in this respect and could overlap with the plurality of first regions 118 and the plurality of second regions 120 in different ways.

Figure 6:
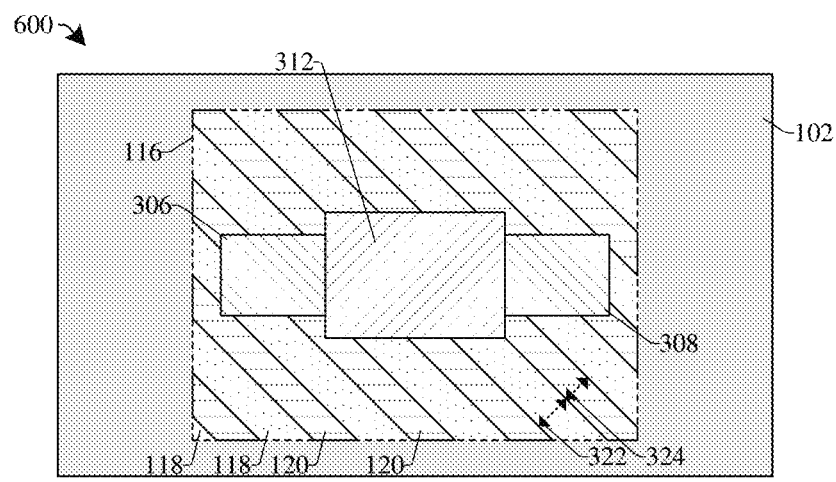
FIG. 6 illustrates a top view of some alternative embodiments of a semiconductor structure including a plurality of first regions separated by a plurality of second regions that are rotated relative to a longest length of a gate electrode.

FIG. 6 illustrates a top view 600 of some alternative embodiments of a semiconductor structure 300 including a plurality of first regions 118 separated by a plurality of second regions 120 that are rotated relative to a longest length of a gate electrode 312.

The top view 600 shows that the plurality of first and second regions 118, 120 extend in a lateral direction at an angle relative to a longest length of the gate electrode 312. Top view 600 shows the angle as 45 degrees, however, the angle is not limited in this respect and can represent a rotation relative to a longest length of the gate electrode 312 greater than 0 degrees and less than 180 degrees.

Figure 7:
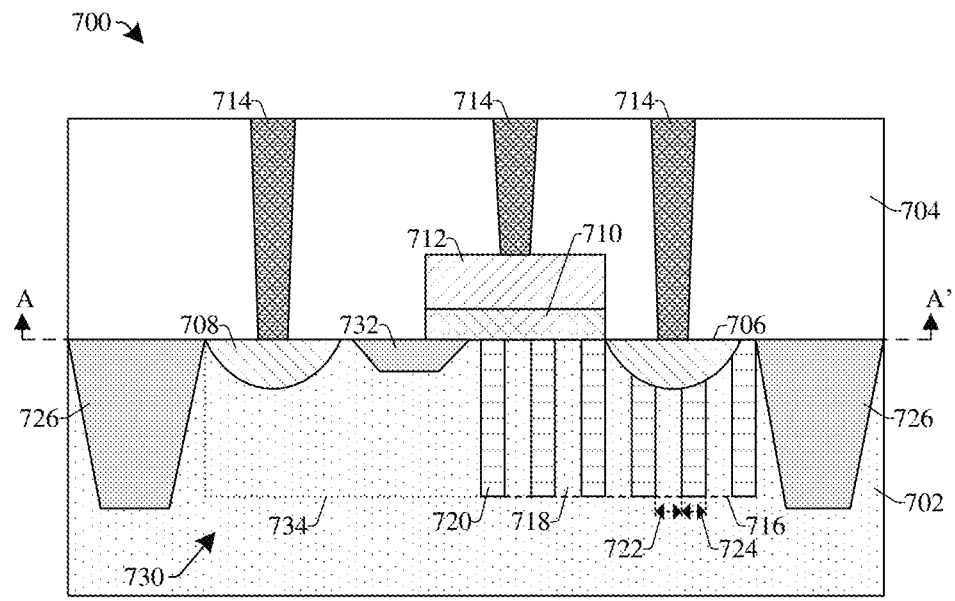
FIG. 7 illustrates a cross-sectional view of some embodiments of a semiconductor structure including a well region of a semiconductor device with a plurality of first regions separated by a plurality of second regions.

FIG. 7 illustrates a cross-sectional view of some embodiments of a semiconductor structure 700 including a well region 716 of a semiconductor device 730 with a plurality of first regions 718 separated by a plurality of second regions 720.

The semiconductor structure 700 comprises an ILD layer 704 disposed over a semiconductor substrate 702. The ILD layer 704 can correspond to the ILD layer 304 of FIG. 3 and the semiconductor substrate 702 can correspond to the semiconductor substrate 102 of FIG. 1. A semiconductor device 730 is disposed in the ILD layer 704 and the semiconductor substrate 702. In some embodiments, the semiconductor device 730 is a LDMOS device and can correspond, for example, to the second device 130 of FIG. 1.

A well region 716 is disposed within the semiconductor substrate 702 where the well region 716 comprises a plurality of first regions 718 separated by a plurality of second regions 720. In some embodiments, the well region 716, the plurality of first regions 718, and the plurality of second regions 720 correspond to the second well region 110, the plurality of first regions 106, and the plurality of second regions 108 respectively of FIG. 1. The well region 716 extends from a top surface of the semiconductor substrate 702 to above a bottom surface of the semiconductor substrate 702 and the plurality of first and second regions 718, 720 extend vertically from a top surface of the well region 716 to a bottom surface of the well region 716. The plurality of first regions 718 have a first width 722 and the plurality of second regions 720 have a second width 724 that is different than the first width 722. In some embodiments the first width 722 and the second width 724 can be the same.

The plurality of first regions 718 comprise a first doping and the plurality of second regions 720 comprise a second doping that is different from the first doping. In some embodiments, the second doping of the plurality of second regions 720 is formed according to the doping process 104 of FIG. 1. In some embodiments, the first doping and the second doping can be of the same doping type (e.g., n-type or p-type) and different doping concentration or density. In other embodiments, the first doping and the second doping are of a different doping type. In yet other embodiments, the first doping can be the same as a doping of the semiconductor substrate 702 or different than the doping of the semiconductor substrate 702.

A gate dielectric 710 is disposed in the ILD layer 704 between the well region 716 and a gate electrode 712. In some embodiments, the gate dielectric 710 and the gate electrode 712 comprise the same materials as the gate dielectric 310 and the gate electrode 312 respectively of FIG. 3. In some embodiments, the gate dielectric 710 and the gate electrode 712 are collectively referred to as a gate stack. The gate stack overlies a portion of the plurality of first and second regions 118, 120.

A source 706 is laterally offset from the gate electrode 712. The source 706 extends laterally over a subset of the plurality of first and second regions 718, 720 from a first top surface of the plurality of first and second regions 718, 720 to above a second top surface of the plurality of first and second regions 718, 720. One or more of the plurality of first and second regions 718, 720 have a curved surface along a bottom surface of the source 706. The well region 716 extends from beyond an outermost edge of the source 706 to under the gate electrode 712 between outermost edges of the gate electrode 712.

A STI structure 732 is disposed within the semiconductor substrate 702 extending from the top surface of the semiconductor substrate 702 to above the bottom surface of the well region 716. The STI structure 732 extends from under the gate electrode 712 past an outermost edge of the gate electrode 712. The STI structure 732 may, for example, be or comprise a dielectric material (e.g., silicon dioxide), a low-k dielectric, or the like.

A drain 708 is disposed in the semiconductor substrate 702 and extends from the top surface of the semiconductor substrate. The drain 708 is separated from the well region 716 and the gate electrode 712 by the STI structure 732. The drain 708 and the STI structure 732 are disposed within a drift region 734 that extends from an outer edge of the well region 716 to the drain 708 within the semiconductor substrate 702. In some embodiments a doping of the drift region 734 can be the same as a doping of the semiconductor substrate 702, in other embodiments the doping of the drift region 734 is different than the doping of the semiconductor substrate 702. The semiconductor device 730 comprises the gate stack, the source 706, the drain 708, the well region 716, and the STI structure 732.

A STI structure 726 extends from a top surface of the semiconductor substrate 702 to below a bottom surface of the well region 716. The STI structure 726 abuts an outer edge of the well region 716 and the drain 708. The STI structure 726 may, for example, be or comprise a dielectric material (e.g., silicon dioxide), a low-k dielectric, or the like. The ILD layer 704 comprises conductive contacts 714 that extend through the ILD layer 704 to contact the source 706, the drain 708, and the gate electrode 712. The conductive contacts 714 may, for example, be or comprise, tungsten (W), copper (Cu), aluminum (Al), or the like.

Figure 8:
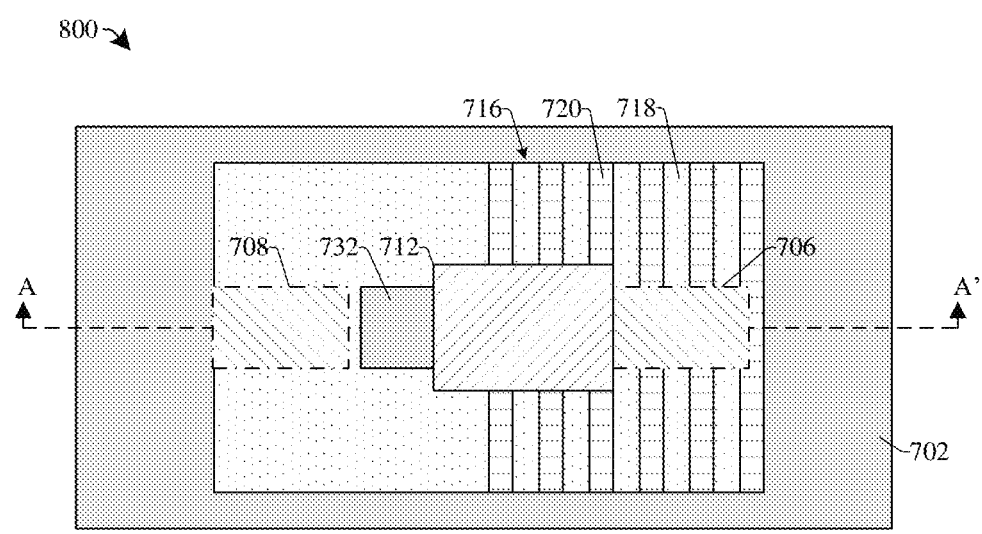
FIG. 8 illustrates a top view of some embodiments of the semiconductor structure as indicated by cut-lines A-A' in FIGS. 7 and 8.

FIG. 8 illustrates a top view 800 of some embodiments of the semiconductor structure 700 as indicated by cut-lines A-A' in FIGS. 7 and 8.

The top view 800 shows the plurality of first and second regions 718, 720 extending in a lateral direction perpendicular to a longest length of the gate electrode 312. The plurality of first and second regions 718, 720 extend laterally past outer edges of the gate electrode 712, and past outer edges of the source 706. Outermost edges of the plurality of first and second regions 718, 720 extend from outside the outer edge of the gate electrode 712 to a region within the outer edge of the gate electrode. In alternative embodiments, the plurality of first and second regions 718, 720 can extend in lateral directions parallel or angularly rotated relative to the longest length of the gate electrode 312, as depicted in FIGS. 5 and 6.

In some embodiments, the semiconductor device 730 can be the second device 130 of FIG. 1 where the well region 716 (analogous to second well region 110 of FIG. 1) can be formed from the single well mask 134 of FIG. 1 simultaneously with the first well region 116 of FIG. 1. A threshold voltage of the semiconductor device 730 can be different than the threshold voltage of the first device 128 where the different threshold voltage of both devices is realized according to the single well mask 134 of FIG. 1.

FIGS. 9-16 illustrate cross-sectional and top views of some embodiments of methods of forming a semiconductor device with a first well region 116 comprising a plurality of first regions 118 separated by a plurality of second regions 120 where the first well region 116 is formed according to a single well mask 134. Although the cross-sectional views 900-1600 shown in FIGS. 9-16 are described with reference to a method, it will be appreciated that the structures shown in FIGS. 9-16 are not limited to the method but rather may stand alone separate of the method. Furthermore, although FIGS. 9-16 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 1-9 may be substituted for embodiments in FIGS. 9-16 although they may not be shown.

Figure 9:
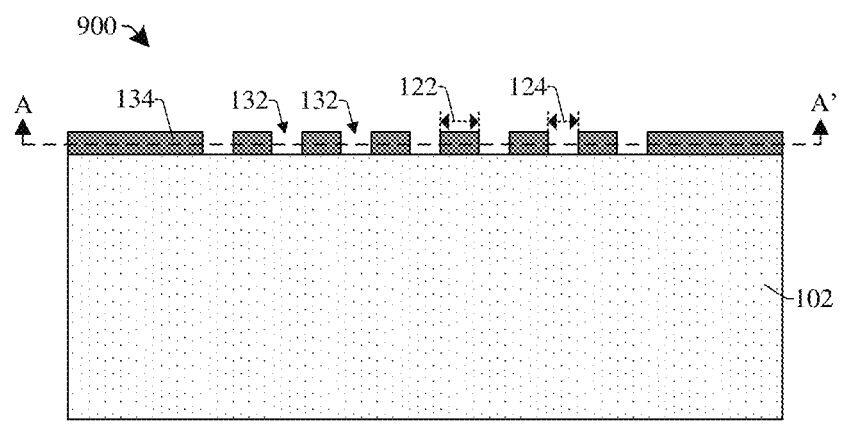
FIGS. 9-16 illustrate cross-sectional and top views of some embodiments of methods of forming a semiconductor device with a first well region comprising a plurality of first regions separated by a plurality of second regions where the first well region is formed according to a single well mask.

As shown in cross-sectional view 900 of FIG. 9, a single well mask 134 is formed over a semiconductor substrate 102. The semiconductor substrate 102 may be or comprise, for example, Si, a monocrystalline silicon, Ge, SiGe, GaAs, some other semiconductor material, or a combination thereof.

In some embodiments, the single well mask 134 may, for example, be deposited by a physical vapor deposition (PVD), a chemical vapor deposition (CVD), or an atomic layer deposition (ALD) process, and may be or comprise a silicon-based material, such as silicon nitride. Forming the single well mask 134 includes a patterning process (not shown). The patterning process may, for example, comprise any of a photolithography process and an etching process. In some embodiments (not shown), a photoresist is formed over the single well mask 134. The photoresist is patterned by an acceptable photolithography technique to develop an exposed photo resist. With the exposed photo resist in place, an etch is performed to transfer the pattern from the exposed photo resist to the underlying layers, for example, the single well mask 134, to form a plurality of slits 132 that extend through the single well mask 134. The etching process may comprise a wet etching process, a dry etching process, or some other suitable etching process. The plurality of slits 132 expose top surfaces of the semiconductor substrate 102. The plurality of slits 132 are of a first slit width 124 separated by a first mask width 122.

Figure 10:
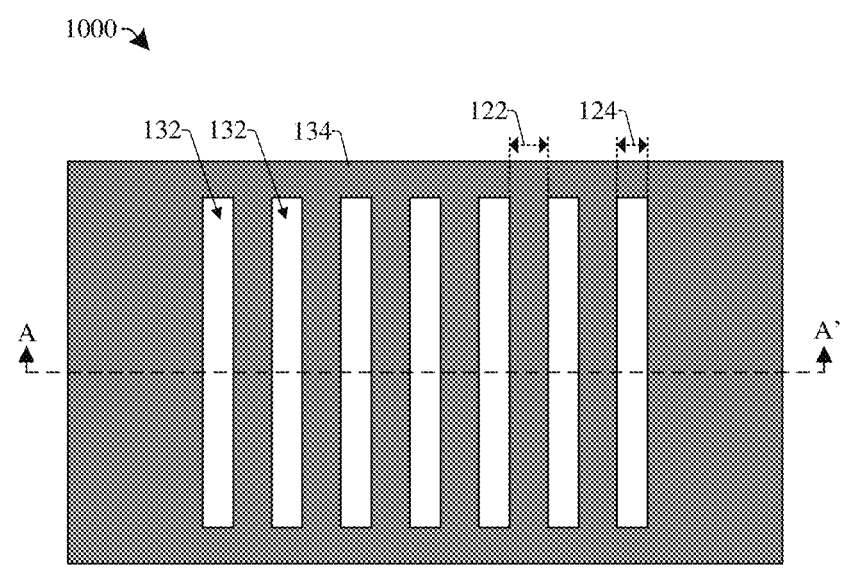

FIG. 10 illustrates a top view 1000 of some embodiments of the cross-sectional view 900 of FIG. 9 as indicated by cut lines A-A' through the single well mask 134 in FIGS. 9 and 10.

As seen in the top view 10000, the plurality of slits 132 are arranged in a horizontal direction creating a plurality of rectangles defined by the first slit width 124 separated by the first mask width 122. In some embodiments the plurality of slits 132 are arranged in a parallel direction analogous to the plurality of first and second regions of FIG. 5, in further embodiments the plurality of slits 132 are rotated analogous to the plurality of first and second regions of FIG. 6.

Figure 11:
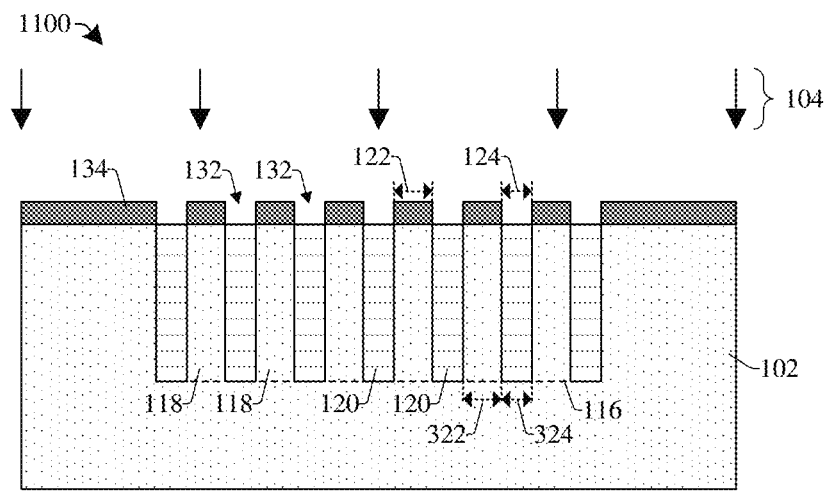

As shown in cross-sectional view 1100 of FIG. 11, a doping process 104 is performed through the plurality of slits 132 of the single well mask 134. The doping process 104 can be performed according to an ion implantation or a diffusion process. The doping process 104 can include a second doping that is different than a doping of the semiconductor substrate 102. In some embodiments, the second doping and the doping of the semiconductor substrate 102 can be of the same doping type (e.g., n-type or p-type) and different doping concentration or density. In other embodiments, the second doping and the doping of the semiconductor substrate 102 are of a different doping type.

The doping process 104 forms a first well region 116 within the semiconductor substrate 102 where the first well region 116 comprises a plurality of first regions 118 separated by a plurality of second regions 120. As such, it can be said that the plurality of first regions 118 and the plurality of second regions 120 form or define the first well region. The plurality of first regions 118 are aligned below the first mask width 122 of the single well mask 134 that separate the plurality of slits 132. The plurality of first regions 118 have a first width 322 that is the same as the first mask width 122. The plurality of second regions 120 are aligned below the plurality of slits 132. The plurality of second regions 120 have a second width 324 that is the same as the first slit width 124. The plurality of second regions 120 are of the second doping according to the doping process 104.

In some embodiments, the plurality of first regions 118 are of a first doping and the same as a doping of the semiconductor substrate 102. In some embodiments, the first doping and the second doping can be of the same doping type (e.g., n-type or p-type) and different doping concentration or density. In other embodiments, the first doping and the second doping are of a different doping type. In yet other embodiments, the first doping can be different than the doping of the semiconductor substrate 102.

By forming the plurality of first and second regions 118, 120 with the single well mask 134 in place with the plurality of slits 132, doping profiles of various devices can be separately formed by, e.g. controlling the first mask width 122 and the plurality of slits 132 for of the various devices. By controlling the first mask width 122 and the plurality of slits 132 for the various devices, different threshold voltages can be realized according to the single well mask 134 and doping process 104.

Figure 12:
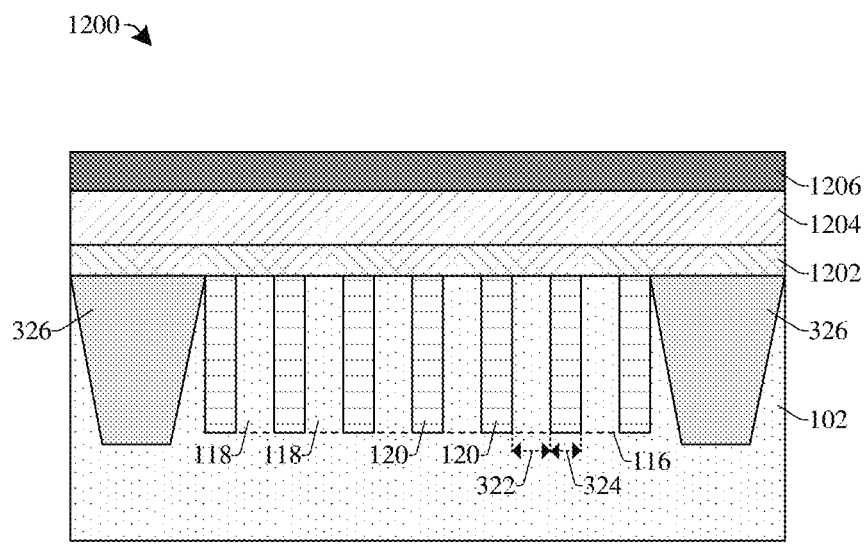

As shown in cross-sectional view 1200 of FIG. 12, the single well mask (134 of FIG. 11) is removed. The single well mask (134 of FIG. 11) may, for example, be removed through a chemical wash process, an etch process, a planarization process, an ashing process, or other suitable removal process. After removing the single well mask (134 of FIG. 11), STI structure 326 is formed in the semiconductor substrate 102 abutting an outer edge of the first well region 116. The STI structure 326 may be formed by selectively etching the semiconductor substrate 102 (not shown) to form a trench in the semiconductor substrate 102, and subsequently filling the trench with a dielectric material. The dielectric material may, for example, be or comprise a dielectric material (e.g., silicon dioxide), a low-k dielectric, or the like. In further embodiments, the semiconductor substrate 102 is selectively etched by forming a masking layer (not shown) over the semiconductor substrate 102, and subsequently exposing the semiconductor substrate 102 to an etchant configured to selectively remove unmasked portions of the semiconductor substrate 102.

A gate dielectric layer 1202 is deposited over the semiconductor substrate 102, the STI structure 326, and the first well region 116. The gate dielectric layer 1202 may, for example, be or comprise, a high-k dielectric material, such HfO, TaO, HfSiO, HfTaO, AlO, ZrO, or the like. A gate electrode layer 1204 is formed over the gate dielectric layer 1202. The gate electrode layer 1204 may, for example, be or comprise a metal, such as Al, Cu, Ti, Ta, W, Mo, Co, or the like. A gate mask 1206 is deposited over the gate electrode layer 1204. The gate mask 1206 may, for example, be or comprise a silicon-based material, such as silicon nitride. The gate dielectric layer 1202, the gate electrode layer 1204, and the gate mask 1206 may, for example, be deposited by a PVD, CVD, or ALD process.

Figure 13:
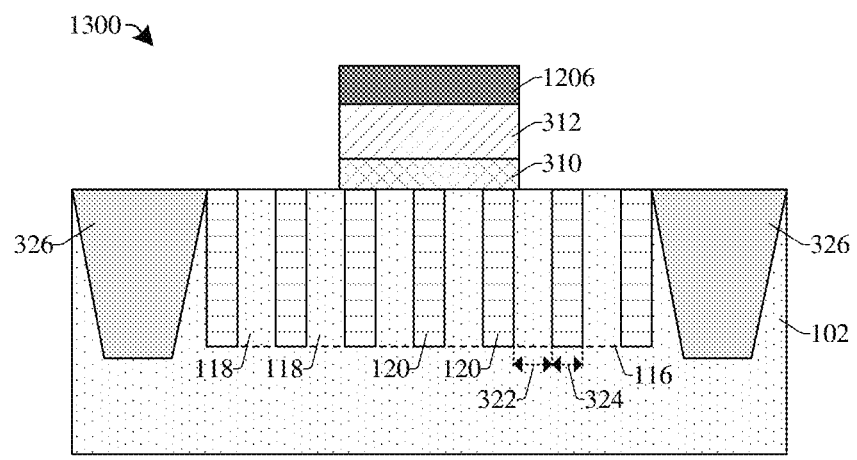

As shown in cross-sectional view 1300 of FIG. 13, the gate dielectric layer (1202 of FIG. 12), the gate electrode layer (1204 of FIG. 12), and the gate mask 1206 are patterned to form a gate electrode 312 and a gate dielectric 310. The gate electrode 312 and the gate dielectric 310 can be referred to as a gate stack.

In some embodiments, a process for forming the gate stack comprises forming a patterned masking layer (not shown) on the gate mask 1206. In various embodiments, the patterned masking layer may be formed by a spin on process and patterned using photolithography. In further embodiments, the process comprises performing an etch into the gate dielectric layer (1202 of FIG. 12), the gate electrode layer (1204 of FIG. 12), and the gate mask 1206 with the patterned masking layer in place, and subsequently stripping the patterned masking layer. In yet further embodiments, the gate dielectric layer (1202 of FIG. 12), the gate electrode layer (1204 of FIG. 12), and the gate mask 1206 are patterned by a single patterning process. In other embodiments, a plurality of patterning process is performed to pattern the gate dielectric layer (1202 of FIG. 12), the gate electrode layer (1204 of FIG. 12), and the gate mask 1206. The gate stack is formed over a portion of the plurality of first and second regions 118, 120.

Figure 14:
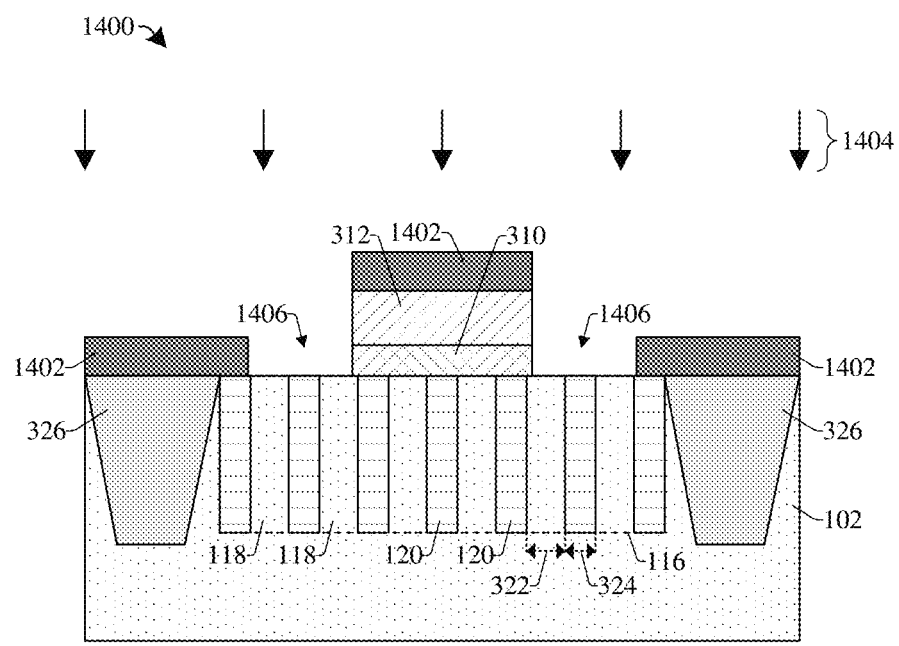

As shown in cross-sectional view 1400 of FIG. 14, the gate mask 1206 is removed and a source/drain mask 1402 is deposited over the gate stack, the first well region 116, the STI structure 326, and the semiconductor substrate 102. In some embodiments, the source/drain mask 1402 may, for example, be deposited by a PVD, a CVD, or an ALD process, and may be or comprise a silicon-based material, such as silicon nitride. In some embodiments, the source/drain mask is patterned to expose source/drain doping openings 1406. The patterning process (not shown) may, for example, comprise any of a photolithography process and an etching process. In some embodiments (not shown), a photoresist is formed over the source/drain mask 1402. The photoresist is patterned by an acceptable photolithography technique to develop an exposed photo resist. With the exposed photo resist in place, an etch is performed to transfer the pattern from the exposed photo resist to the underlying layers, for example, the source/drain mask 1402, forming source/drain doping openings 1406 that extend through the source/drain mask 1402. The etching process may comprise a wet etching process, a dry etching process, or some other suitable etching process.

The source/drain doping openings 1406 expose an upper surface of the plurality of first and second regions 118, 120 on opposing sides of the gate stack. The source/drain doping openings 1406 extend from opposing sides of the gate stack to an outer region of the plurality of first and second regions 118, 120. The source/drain doping opening 1406 undergo a source/drain doping process 1404. The source/drain doping process 1404 can be performed according to an ion implantation or a diffusion process. The source/drain source/gate doping process 1404 can include a dopant different than the first dopant of the plurality of first regions and the second dopant of the plurality of second regions.

Figure 15:
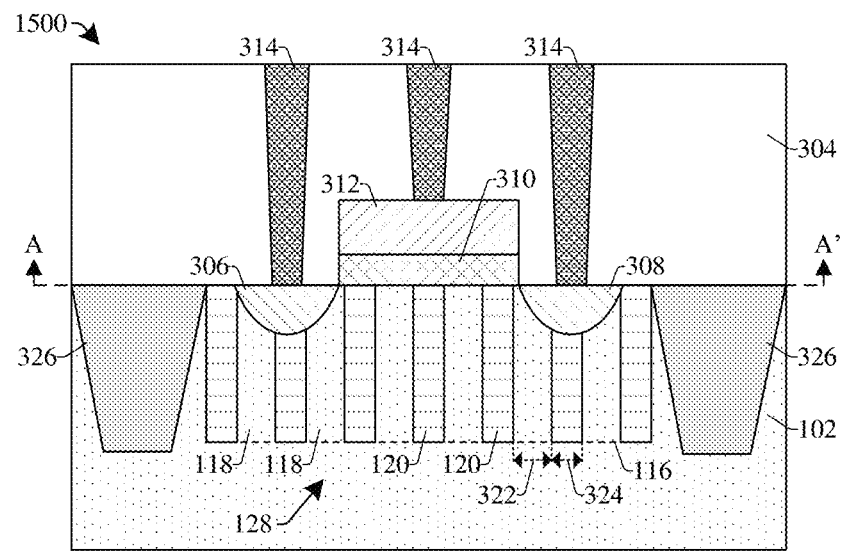

As shown in cross-sectional view 1500 of FIG. 15, the source/drain doping process (1404 of FIG. 14) forms a source 306 and a drain 308 under the source/drain mask (1402 of FIG. 14). The source 306 and the drain 308 are formed on opposing sides of the gate stack. The source 306 and the drain 308 are formed extending from top surface of the first well region 116 extending into the first well region 116 above a bottom surface of the first well region 116. The source 306 and the drain 308 are also formed with a curved surface contacting the first well region 116. As such, the source/drain doping process (1404 of FIG. 14) results in a second upper surface of the plurality of first and second regions 118, 120 that is below a first upper surface of the plurality of first and second regions 118, 120 that is level with the top surface of the semiconductor substrate 102. Furthermore, the second upper surface of the plurality of first and second regions 118, 120 is curved beneath the source 306 and the drain 308. The first well region 116, the source 306, the drain 308, and the gate stack form a first device 128.

An ILD layer 304 is deposited over the semiconductor substrate 102, the STI structure 326, the source 306, the drain 308, and the gate electrode 312 and gate dielectric 310. The ILD layer 304 may, for example, be deposited by a PVD, CVD, or ALD process, and may comprise a low-k dielectric, an oxide, a nitride, an oxy-nitride, undoped silicate glass, doped silicon dioxide, borosilicate glass, phosphoric silicate glass, borophosphosilicate glass, fluorinated silicate glass, a spin-on glass, or the like.

Conductive contacts 314 are formed in the ILD layer 304 and extend through the ILD layer 304 and contact the source 306, the gate electrode 312, and the drain 308. In some embodiments, a process for forming the conductive contacts 314 (not shown) comprises forming a masking layer covering the ILD layer 304. The masking layer is patterned with a layout of the conductive contacts 210, and an etch is performed into the ILD layer 304 with the patterned masking layer in place to form contact openings corresponding to the conductive contacts 314. The patterning may be, for example, performed by photolithography or some other patterning process. A conductive layer is then deposited covering the ILD layer 304 and filling the contact openings, and a planarization process is performed into the conductive layer until the ILD layer 304 is reached. The conductive layer may be deposited by, for example, CVD, PVD, ALD, sputtering, electroless plating, electroplating, or some other deposition or plating process. The planarization process may be, for example, a chemical-mechanical planarization (CMP) process or some other suitable planarization process. In various embodiments, the process may be part of a single damascene like process or a dual damascene like process. The conductive contacts 314 may, for example, be or comprise, W, Cu, Al, or the like. Conductive contacts 314 (right and left) are formed over the source 306 and drain 308 respectively and over the second upper surface of the plurality of first and second regions 118, 120.

Figure 16:
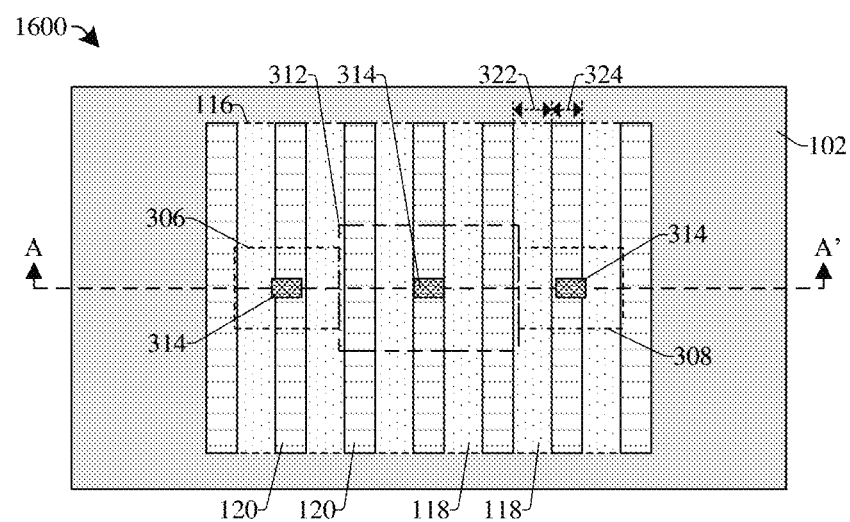

FIG. 16 illustrates a top view 1600 of some embodiments of the cross-sectional view 1500 of FIG. 15 as indicated by cut lines A-A'. The gate electrode 312, source 306, and drain 308 are shown as transparent for illustrative purposes. The plurality of first and second regions 118, 120 are formed in a lateral direction perpendicular to a longest length of the gate electrode 312 and extend laterally past outer edges of the gate electrode 312, the source 306, and the drain 308. In alternative embodiments, the plurality of first and second regions 118, 120 can extend in lateral directions parallel or angularly rotated relative to the longest length of the gate electrode 312, as depicted in FIGS. 5 and 6 and would correspond to the plurality of slits (132 of FIG. 10) being formed horizontally or rotated as discussed previously in FIG. 10.

FIGS. 9 through 16 show the formation of the first device 128 with the first well region 116 formed from a single well mask 134 comprising a plurality of slits 132 separated by the first mask width 122. The doping process 104 results in formation of the plurality of first regions 118 separated from the plurality of second regions 120 which control the threshold voltage of the first device 128. Furthermore, the threshold voltage of the first device and a threshold voltages of other devices (e.g. the second device 130 of FIG. 1) can be controlled according to the single well mask 134 where the threshold voltage of the first device and the threshold voltages of other devices are different without the need of multiple well masking steps.

FIG. 17 illustrates a flow diagram of some embodiments of a method 1700 for forming a first device with a first well region 116 comprising a plurality of first regions 118 separated by a plurality of second regions 120 is provided.

At act 1702, a single well mask is deposited over a semiconductor substrate and patterned to form a plurality of slits separated by a plurality of first mask width. FIGS. 9 and 10 illustrate cross-sectional view 900 and top view 1000 respectively corresponding to some embodiments of act 1702.

At act 1704, a doping process is performed through the plurality of slits to form a plurality of first regions separated by a plurality of second regions within a first well region. FIGS. 9 and 11 illustrate cross-sectional views 900 and 1100 corresponding to some embodiments of act 1704.

At act 1706, the single well mask is removed and a STI structure is formed in the semiconductor substrate abutting an outer edge of the first well region and a gate dielectric and gate electrode are formed over the first well region. The gate dielectric and gate electrode form a gate stack. FIGS. 12 and 13 illustrate cross-sectional views 1200 and 1300 corresponding to some embodiments of act 1706.

At act 1708, a source/gate mask is deposited and patterned over the gate stack, the first well region, the STI structure, and semiconductor substrate to form source/gate doping openings over the first well region, laterally offset from the gate stack. FIG. 14 illustrates cross-sectional view 1400 corresponding to some embodiments of act 1708.

At act 1710, a source/drain doping process is performed through the source/gate doping openings to form a source and a drain within the first well region. FIG. 14 illustrates cross-sectional view 1400 corresponding to some embodiments of act 1710.

At act 1712, the source/gate mask is removed and an ILD layer is deposited over the semiconductor substrate, first well region, STI structure, source, and drain. Conductive contacts are formed through the ILD layer that couple to the gate electrode, source, and drain. FIGS. 15 and 16 illustrate cross-sectional views 1500 through 1600 respectively corresponding to some embodiments of act 1712.

Although the method 1700 is illustrated and/or described as a series of acts or events, it will be appreciated that the method 1700 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In various embodiments, the present application provides a semiconductor structure including: a well region disposed within a semiconductor substrate; the well region including a plurality of first regions separated by a plurality of second regions, where the plurality of first regions are of a first doping and the plurality of second regions are of a second doping different than the first doping; and a gate electrode overlying the well region where the gate electrode is disposed laterally over a portion of the plurality of first regions and a portion of the plurality of second regions.

In various embodiments, the present application provides a semiconductor structure including: a well region disposed within a semiconductor substrate; the well region including a plurality of first regions separated by a plurality of second regions; and a gate electrode overlying the well region where the plurality of first regions and plurality of second regions extend vertically beneath the gate electrode from a top surface of the well region to a bottom surface of the well region.

In various embodiments, the present application provides a method of forming a semiconductor structure, including: forming a single well mask over a semiconductor substrate; patterning the single well mask to form a plurality of slits separated by a mask width; performing a doping process on the semiconductor substrate through the single well mask to form a well region where a dopant of the doping process is different than a dopant of the semiconductor substrate; where the doping process forms a plurality of first regions aligned under the mask width and separated by a plurality of second regions aligned under the plurality of slits where the plurality of first regions and the plurality of second regions form the well region; and forming a drain and a source within the well region; and forming a gate electrode over the well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a well region within a semiconductor substrate;
    the well region formed with a plurality of first regions that abut and alternate with a plurality of second regions, wherein the plurality of first regions are formed with a first doping and the plurality of second regions are formed with a second doping that is different from the first doping, and wherein from a top view;
        the plurality of first regions and the plurality of second regions extend continuously in parallel with one another from a first end to a second end of a width of the well region in a first direction; and
        the plurality of second regions alternate with and are laterally separated by the plurality of first regions in a second direction perpendicular to the first direction;
    forming a gate stack on the plurality of first regions and the plurality of second regions; and
    forming a first source/drain region on a top surface of the plurality of first and second regions, wherein the first source/drain region is formed extending from a uniform edge of the well region that spans the width of the well region and is common with an edge of one of the plurality of first regions or one of the plurality of second regions that spans the width of the well region, and the uniform edge is common with an edge of the gate stack, and the plurality of first regions alternate with the plurality of second regions in the second direction that is perpendicular to the uniform edge.

2. The method of claim 1, wherein the first doping and the second doping have a different doping concentration.

3. The method of claim 1, wherein the first doping and the second doping are of a same doping type.

4. The method of claim 1, wherein the plurality of first regions are formed with a first width and the plurality of second regions are formed with a second width that is different from the first width.

5. The method of claim 1, further comprising:
    forming a second source/drain region laterally offset from the well region; and
    forming a shallow trench isolation (STI) structure within the semiconductor substrate, the STI structure formed between the second source/drain region and the well region.

6. The method of claim 1, further comprising:
    forming a second source/drain region laterally offset from the well region, wherein the second source/drain region is formed within a drift region of the semiconductor substrate, wherein the drift region is adjacent to the well region.

7. The method of claim 1,
    forming a second source/drain region that is laterally offset from the plurality of first regions and the plurality of second regions; and
    forming the gate stack with the edge of the gate stack aligned over an edge of the first source/drain region, and forming a second edge of the gate stack that is opposite of the edge of the gate stack, wherein the second edge of the gate stack is formed laterally offset from the second source/drain region.

8. The method of claim 7, further comprising:
forming a source/drain mask over the semiconductor substrate and the well region;
patterning the source/drain mask to expose a portion of the well region adjacent to the edge of the gate stack; and
performing a doping process with the source/drain mask in place to form the first source/drain region.

9. The method of claim 7, further comprising:
forming the first source/drain region with an upper surface that is substantially level the top surface of the plurality of first and second regions.

10. A method of forming a semiconductor structure, the method comprising:
forming a well region within a semiconductor substrate, wherein the well region is formed with a plurality of first regions separated by a plurality of second regions, wherein the plurality of first regions and the plurality of second regions extend from a top surface of the semiconductor substrate and comprise a same doping type, wherein from a top view, across a length of the well region and at an interior of the well region, outer sidewalls of each of the plurality of first regions at the interior of the well region are entirely bordered by the plurality of second regions, and outer sidewalls of each of the plurality of second regions at the interior of the well region are entirely bordered by the plurality of first regions;
forming a gate stack on a surface of the plurality of first and second regions, wherein from the top view a longest dimension of the gate stack extends perpendicular relative to a longest laterally extending dimension of the plurality of first and second regions; and
forming a source/drain region within the plurality of first and second regions, wherein a continuous bottom region of the source/drain region is formed contacting alternating portions of the plurality of first and second regions.

11. The method of claim 10, wherein the method further includes:
performing a doping process to form the source/drain region, wherein the doping process is performed over a surface between an outer edge of the gate stack and an outer edge of one of the plurality of first and second regions.

12. The method of claim 10, wherein before forming the gate stack the method further comprises:
forming a shallow trench isolation (STI) structure within the semiconductor substrate abutting an outer edge of the well region.

13. The method of claim 10, wherein forming the well region comprises:
forming a single well mask over the semiconductor substrate; and
performing a doping process with the single well mask in place to form the plurality of first regions separated by the plurality of second regions.

14. The method of claim 13, wherein the single well mask is formed with a plurality of slits separated by a mask width.

15. The method of claim 14, wherein a width of the plurality of slits and the mask width are a same width.

16. The method of claim 10, wherein the plurality of first regions and the plurality of second regions are formed with outermost edges that laterally extend from outside of an outer edge of the gate stack to a region within the outer edge of the gate stack.

17. A method of forming a semiconductor structure, comprising:
forming a single well mask over a well region of a semiconductor substrate;
patterning the single well mask to form a plurality of slits, wherein from a top view, the plurality of slits span a width of the well region, the plurality of slits entirely separated from one another by a plurality of mask widths, wherein the plurality of mask widths span the width of the well region and are entirely separated from one another by the plurality of slits;
performing a doping process on the semiconductor substrate through the single well mask to form a well wherein a dopant of the doping process is different than a dopant of the semiconductor substrate,
wherein the doping process forms a plurality of first regions aligned under the mask widths and separated by a plurality of second regions aligned under the plurality of slits wherein the plurality of first regions and the plurality of second regions form the well;
forming a drain or a source within the plurality of first regions and the plurality of second regions, wherein a bottom region of the drain or the source is formed meeting a top region of the plurality of first regions and the plurality of second regions at a plurality of interfaces; and
forming a gate stack on the plurality of first and second regions.

18. The method of claim 17, wherein the dopant of the doping process is a same dopant type of the dopant of the semiconductor substrate.

19. The method of claim 17, further comprising removing the single well mask and forming a source/drain mask over a surface of the plurality of first regions and the plurality of second regions; and
performing a source/drain doping process with a source/drain dopant that is a different dopant type than the dopant of the doping process and the dopant of the semiconductor substrate to form the drain or the source.

20. The method of claim 19, wherein the source/drain doping process forms the drain or the source extending from a first top surface of the plurality of first regions to above a second top surface of the plurality of first regions that is lower than the first top surface.

* * * * *